(12) United States Patent
Jahanbani et al.

(10) Patent No.: US 6,564,469 B2
(45) Date of Patent: May 20, 2003

(54) DEVICE FOR PERFORMING SURFACE TREATMENT ON SEMICONDUCTOR WAFERS

(75) Inventors: Mohamad Jahanbani, Tianjin (CN);
Stefan Ruemmelin, Dresden (DE);
Ronald Hoyer, Dresden (DE)

(73) Assignees: Motorola, Inc., Schaumburg, IL (US);
Semiconductor 300 GmbH & Co. KG, Dresden (DE); Infineon Technologies AG, Munich (DE)

( * ) Notice: Subject to any disclaimer, the term of this patent is extended or adjusted under 35 U.S.C. 154(b) by 16 days.

(21) Appl. No.: 09/901,381

(22) Filed: Jul. 9, 2001

(65) Prior Publication Data

US 2003/0005596 A1 Jan. 9, 2003

(51) Int. Cl.⁷ ................................................. F26B 21/06
(52) U.S. Cl. ............................... 34/76; 34/107; 34/614; 34/202; 34/218
(58) Field of Search ............................. 34/72–78, 107, 34/611, 614, 165, 168–170, 174, 201, 202, 218, 219

(56) References Cited

U.S. PATENT DOCUMENTS

| | | | | |
|---|---|---|---|---|
| 5,369,891 A | * | 12/1994 | Kamikawa | 34/470 |
| 5,569,330 A | | 10/1996 | Schild et al. | 134/1 |
| 5,571,337 A | | 11/1996 | Mohindra et al. | 134/25.4 |
| 5,634,978 A | | 6/1997 | Mohindra et al. | 134/2 |
| 5,685,327 A | | 11/1997 | Mohindra et al. | 134/95.2 |
| 5,884,640 A | | 3/1999 | Fishkin et al. | 134/95.2 |
| 5,913,981 A | | 6/1999 | Florez | 134/3 |
| 5,940,985 A | * | 8/1999 | Kamikawa et al. | 34/471 |
| 5,958,146 A | | 9/1999 | Mohindra et al. | 134/2 |
| 6,009,890 A | * | 1/2000 | Kaneko et al. | 134/133 |
| 6,029,371 A | * | 2/2000 | Kamikawa et al. | 34/516 |
| 6,045,624 A | * | 4/2000 | Kamikawa et al. | 134/21 |
| 6,050,275 A | * | 4/2000 | Kamikawa et al. | 134/102.3 |
| 6,119,367 A | * | 9/2000 | Kamikawa et al. | 34/164 |
| 6,131,588 A | * | 10/2000 | Kamikawa et al. | 134/102.3 |
| 6,158,449 A | * | 12/2000 | Kamikawa | 134/140 |
| 6,164,297 A | * | 12/2000 | Kamikawa | 134/200 |
| 6,197,123 B1 | * | 3/2001 | Poag et al. | 134/18 |
| 6,286,524 B1 | * | 9/2001 | Okuchi et al. | 134/102.3 |
| 6,318,386 B1 | * | 11/2001 | Kamikawa et al. | 134/902 |
| 6,319,329 B1 | * | 11/2001 | Kamikawa et al. | 134/102.3 |
| 6,342,104 B1 | * | 1/2002 | Kamikawa et al. | 134/102.3 |
| 6,413,355 B1 | * | 7/2002 | Kamikawa et al. | 438/745 |
| 2002/0029788 A1 | * | 3/2002 | Verhaverbeke et al. | 134/1.3 |

* cited by examiner

*Primary Examiner*—Ira S. Lazarus
*Assistant Examiner*—Andrea M. Ragonese

(57) ABSTRACT

A device for performing surface treatment on semiconductor wafers has a cassette (1) for accommodating a plurality of wafers (5) in its interior (3); the wafers (5) are aligned in a first row. The wafer surfaces (51) are essentially in parallel with each other. The cassette (1) has a side-wall (10) which can be arranged essentially perpendicular with respect to the wafer surfaces (51); the side-wall (10) has openings (111'–145') on its face (101) which is directed to the wafers (5), the openings (111'–145') are aligned in second rows, the second rows are essentially parallel to the first row; the openings (111'–114') are connected to respective supply channels (11', 12', 13', 14', 15') for transporting a surface treatment medium which is fed to one (15') of these supply channels via a feeding point (FP). The cross-section of the openings (111'–145') is variable.

11 Claims, 2 Drawing Sheets

DEVICE FOR PERFORMING SURFACE TREATMENT ON SEMICONDUCTOR WAFERS

FIELD OF THE INVENTION

The present invention generally relates to a device for performing a surface treatment on semiconductor wafers.

BACKGROUND OF THE INVENTION

U.S. Pat. No. 5,958,146 discloses an ultra-low particle semiconductor cleaner using heated fluids. In general, a surface treatment on semiconductor wafers is known wherein water is removed from the major surfaces of the wafers by directing isopropanol alcohol mixed with nitrogen gas onto the surfaces (also referred to as IPA treatment). Due surface adhesion effects, the isopropanol alcohol occupies major surfaces, expels water and finally evaporates. In other words, as water recedes, it gets displaced with a thin film of isopropanol alcohol vapor and nitrogen mixture.

FIG. 1 illustrates a known device for performing a surface treatment on semiconductor wafers. In FIG. 1, reference sign 1 denotes a wafer cassette. The wafer cassette 1 is designed for accommodating a plurality of semiconductor wafers 5 in its interior 3, wafers 5 have major surfaces 51. In the interior 3 of cassette 1, there are grooves which are not shown and which are designed for receiving wafers 5 such that wafers 5 are aligned in a row having their major surfaces 51 essentially in parallel with each other.

Moreover, the cassette 1 comprises a top lid 10 which is pivotably hinged by a hinge indicated with reference sign 4. In top lid 10 there are supply channels 12, 13, 15 for transporting a surface treatment medium, here a mixture of isopropanol alcohol and nitrogen in gaseous state, from a feeding point FP (see FIG. 2) to openings 121 to 124 and 131 to 134 which are provided on the face 101 of the top lid 10 which is directed to the semiconductor wafers. Thus, the surface treatment medium supplied via the feeding point FP to the supply channels 12, 13, 15 is distributed over wafers 5 via openings provided in supply channels 12 and 13, respectively.

Moreover, reference sign 20 in FIG. 1 denotes an IPA bubbler, which is fed with IPA by supply line 27 and with nitrogen by supply line 25. Reference sign 28 denotes an exhaust line, and 29 denotes a feeding line for transporting the IPA/nitrogen mixture to feeding point FP.

FIG. 2 illustrates a magnified view of the known device for performing a surface treatment on semiconductor wafers of FIG. 1 for illustrating the top lid thereof. FIG. 2 shows a view on to top lid 10 from above. As becomes apparent from FIG. 2, supply channels 12, 13 each comprise a plurality of openings 121 to 124 and 131 to 134, respectively, which in this example are formed as circular openings. Feeding point FP which introduces the surface treatment medium from above is arranged in the middle of supply channel 15 which connects supply channels 12 and 13. In this example, feeding point FP is arranged asymmetrically with respect to supply channels 12, 13. In other words, the openings 121, 131 and one of supply channels 12, 13 are more distant from feeding point FP than openings 124, 134 at the other end of supply channels 12, 13. Moreover, in this design all openings 121 to 124 and 131 to 134 have the same geometrical size. Furthermore, supply channels 12, 13 have a rather narrow span which is much smaller than the diameter of a wafer 5 which is schematically indicated by the dashed line in FIG. 2.

With the known device shown in FIG. 2 incomplete water removal from the wafer surfaces and formation of high particles due to lack of non-uniform IPA flow and delivery in front and back of the cassette constitutes a serious problem. In particular, at present this problem has to be obviated by running 40 wafers instead of possible 50 wafers in cassette 1.

Since the known IPA manifold of FIG. 2 neither delivered uniformly nor sufficiently, the water might be removed incompletely from the wafer major surfaces and hence forms water marks on hydrophobic surface which might show up as particles and therefore detracts the process yield. The current IPA holes in the rows are of the same size along the rows and this creates different pressures along the rows. As a consequence, the flow rate of the surface treatment medium of holes having a different distance from the feeding point is different, namely the flow rate decreases with increasing distance from the feeding point.

The present invention seeks to provide to a device for performing a surface treatment on semiconductor wafers which mitigates or avoids these and other disadvantages and limitations of the prior art.

DETAILED DESCRIPTION OF A PREFERRED EMBODIMENT

Figure 1:
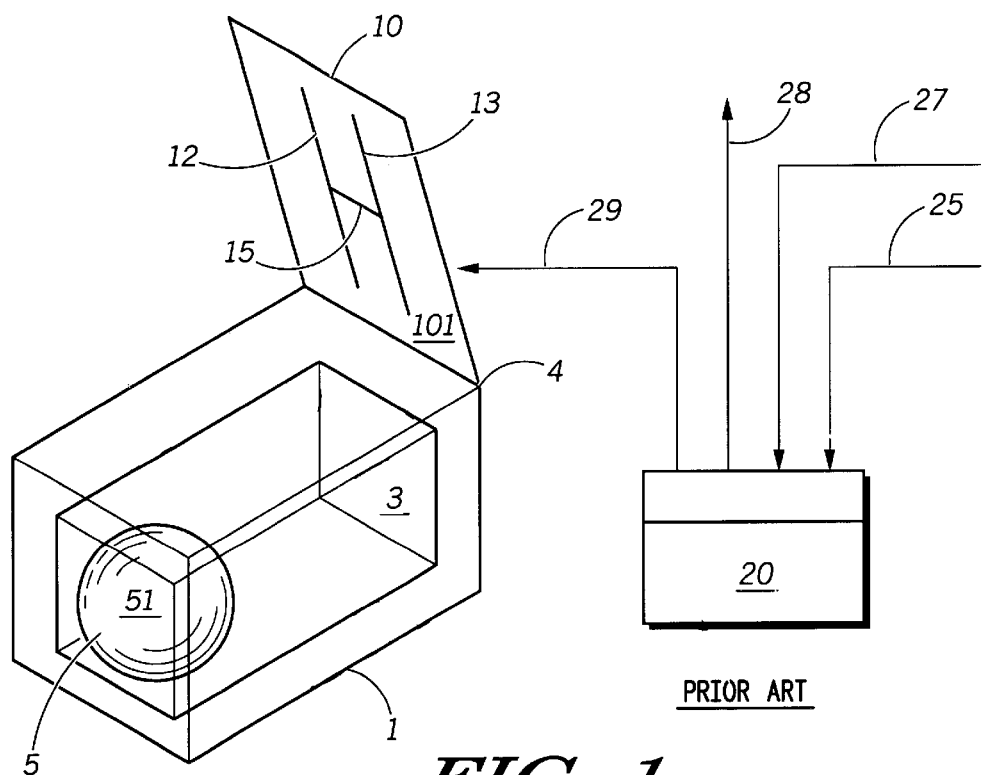
FIG. 1 illustrates a known device for performing a surface treatment on semiconductor wafers.
Figure 2:
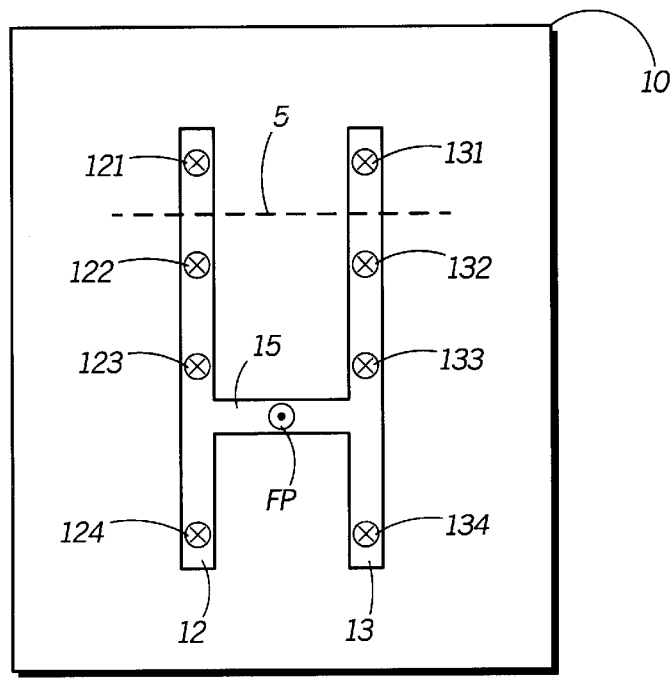
FIG. 2 illustrates a magnified view of the known device for performing a surface treatment on semiconductor wafers for illustrating the top lid thereof.

In accordance with the present invention, a device for performing a surface treatment on semiconductor wafers comprises a cassette for accommodating a plurality of semiconductor wafers in its interior, the wafers being aligned in a first row having their major surfaces essentially in parallel with each other; the cassette having a side-wall which can be arranged essentially perpendicular with respect to the major surfaces of the semiconductor wafers; the side-wall having openings on its face which is directed to the semiconductor wafers, which openings aligned in second rows, the second rows being essentially parallel to the first row; the openings being connected to respective supply channels for transporting a surface treatment medium which is fed to one of these supply channels via a feeding point and which is distributed via the openings onto the major surfaces of the wafers; wherein a cross-section of the openings is variable.

The general idea underlying the present invention is that the cross-section of the openings is variable for compensating adverse pressure effects which render the distribution of the surface treatment medium inhomogeneous.

With the new design according to the present invention, the surface treatment medium gets delivered in a more uniform fashion in terms of delivery as well as providing better vapor coverage for wafers and cassettes. It also gets easily delivered to the front and back of the cassette because of the new delivery design manifold in conjunction with multiple rows dispense as well as variable size nozzles and hence results in a better particle performance and higher yields.

In particular, the device according to the present invention has the following advantages. It delivers surface treatment fluid more uniformly and sufficiently. It reduces high particles in front and back of the cassette. It eliminates the cassette edge effect. It improves the throughput for full batch processing. It effects less equipment downtime and more stable processing. It is necessary for processing of 300 mm wafer technology and tool extendibility.

According to a preferred embodiment, the cross-section increases with increasing distance from the feeding point. According to another preferred embodiment, the supply channels are symmetrically arranged with respect to the feeding point. According to another preferred embodiment, the supply channels comprise a first supply channel being arranged essentially in the middle of the first row and perpendicular thereto; and a plurality of second supply channels being arranged essentially perpendicular to the first supply channel and connected thereto such that the second supply channels are essentially parallel to the first row. According to another preferred embodiment, the second supply channels have a length which is essentially equal to the length of the first row. According to another preferred embodiment, the second supply channels have a span which is essentially equal to a diameter of the plurality of wafers. According to another preferred embodiment, the feeding point is essentially in the middle of the first supply channel. According to another preferred embodiment, the cross-section of the openings is essentially constant along the first supply channel and increases in both directions in the second supply channels starting from a crossing with the first supply channel. According to another preferred embodiment, the cross-section of the openings linearly increases. According to another preferred embodiment, the surface treatment medium contains isopropanol alcohol in gaseous state. According to another preferred embodiment, the side-wall is a top lid of the cassette which is pivotably hinged.

Throughout the figures, the same reference signs denote the same or equivalent parts.

Figure 3:
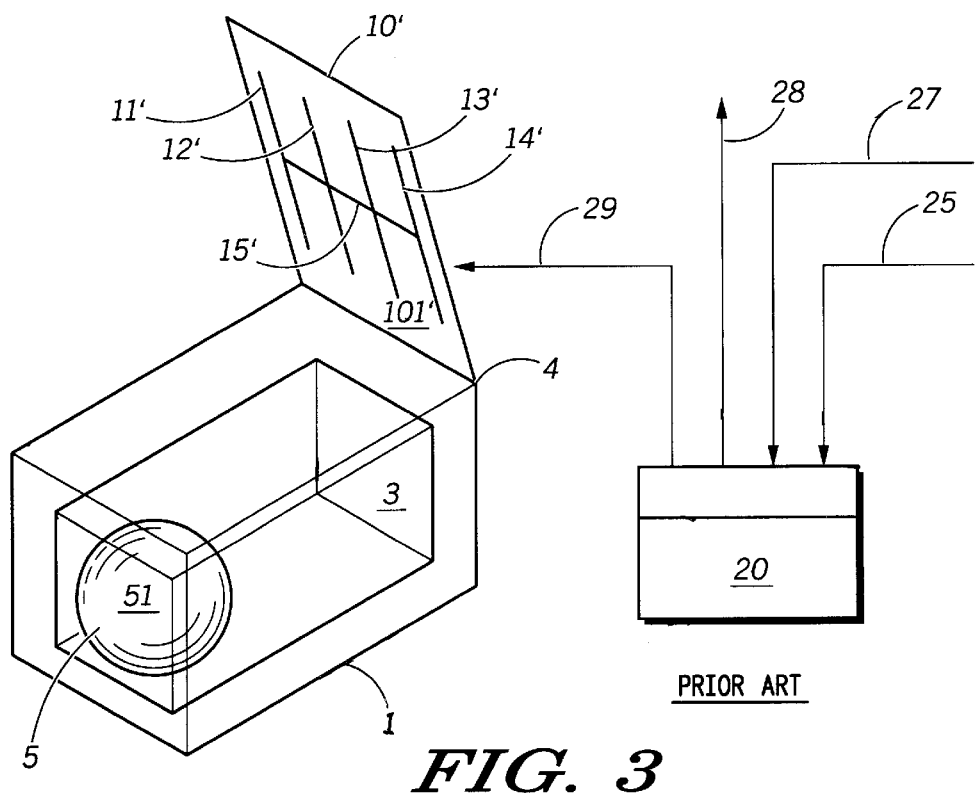
FIG. 3 illustrates a device for performing a surface treatment on semiconductor wafers according to an embodiment of the invention.

FIG. 3 illustrates a device for performing a surface treatment on semiconductor wafers according to an embodiment of the invention. The other components of this embodiment except of the top lid are the same as already described in connection with FIG. 1, and a repeated description thereof will be omitted.

In addition to the components already described, reference 10' in FIG. 3 denotes a top lid specially designed according to the invention, having a first supply channel 15' and second supply channels 11', 12', 13', 14' arranged perpendicular thereto. Supply channels 11' to 14' have a span which is essentially equal to the diameter of the semiconductor wafers 5, namely here 300 mm.

Figure 4:
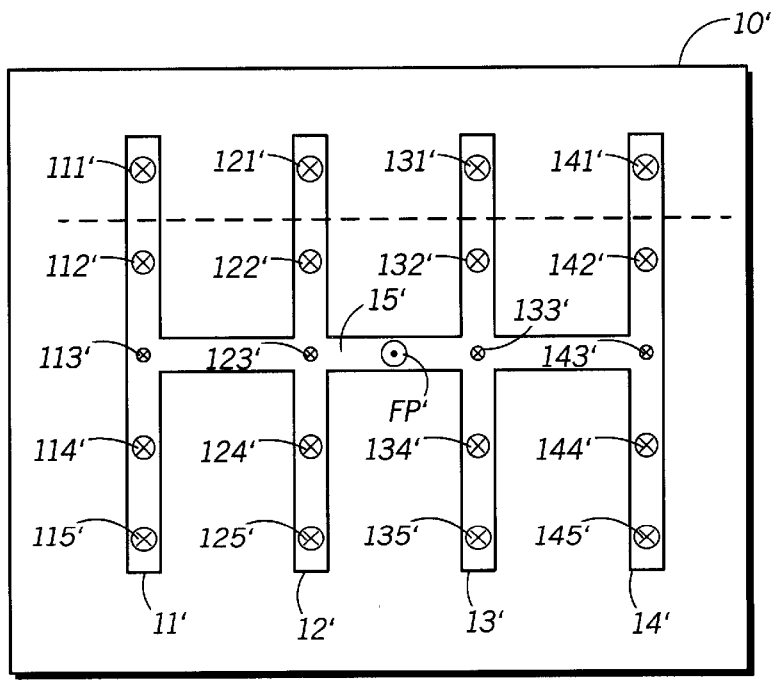
FIG. 4 illustrates a magnified view of the device for performing a surface treatment on semiconductor wafers of FIG. 3 for illustrating the top lid thereof.

FIG. 4 illustrates a magnified view of the device for performing a surface treatment on semiconductor wafers of FIG. 1 for illustrating the top lid thereof.

As may be obtained from FIG. 4, the top lid 10' according to the embodiment of the invention comprises a first supply channel 15' which is essentially arranged in the middle of the row of wafers 5 and perpendicular to the row.

First supply channel 15' comprises four openings 113', 123', 133' and 143' having a certain diameter. Moreover, there is a plurality of second supply channels 11', 12', 13', 14' which are arranged essentially perpendicular to first supply channel 15' and connected thereto such that second supply channels 11', 12', 13', 14' are essentially parallel to the row of wafers 5. The supply channels 11', 12', 13', 14' are symmetrically arranged with respect to the feeding point FP'. In other words, the holes arranged at the ends of supply channels 11', 12', 13', 14' are all substantially equally distant from the feeding point FP'. Moreover, the cross-section of the openings 111' to 115', 121' to 125', 131' to 135', 141' to 145' varies along the direction of the supply channels 11', 12', 13', 14', namely increases in both directions starting from a crossing with the first supply channel. Here in this example, cross-sections of openings linearly increase.

The design of the top lid 10' shown in FIG. 4 has the effect that the surface treatment medium, here IPA, is uniformly distributed over the wafers 5 contained in cassette 1 in absence of any differential pressure effects. In addition, due to the symmetrical arrangement covering the diameter of the wafers 5, it is possible to await any edge effects or inhomogeneity effects. Thus, the embodiment shown in FIGS. 3–4 allows to reduce particle counts in the front and back of the cassette 1 and to process a full capacity of for example 50 wafers at the same time without incurring problems with water marks formation.

By designing new IPA manifold and increasing IPA rows from 2 to 4 or higher multiples and incorporation of variable size nozzles instead of fixed holes, the delivery and distribution improved dramatically. This eliminates incomplete water removal from the wafer surfaces as well as cassette edge effect problems for non-displaced water on the top of the cassette and in the grooves, the wafers come into contact with it.

While the invention has been described in terms of particular structures and devices, those of skill in the art will understand based on the description herein that it is not limited merely to such examples and that the full scope of the invention is properly determined by the claims that follow.

Particularly, the geometry of the supply channels and the openings and the feeding point(s) may be varied in many ways. Also, the invention is applicable to other surface treatment methods and not limited to the above described IPA treatment method.

What is claimed is:

1. A device for performing a surface treatment on semiconductor wafers, said device comprising:

a cassette for accommodating a plurality of said semiconductor wafers in its interior, said wafers being aligned in a first row having their major surfaces essentially in parallel with each other;

said cassette having a side-wall which can be arranged essentially perpendicular with respect to said major surfaces of said semiconductor wafers;

said side-wall having openings on its face which is directed to said semiconductor wafers, which openings aligned in second rows, said second rows being essentially parallel to said first row; and said openings being connected to respective supply channels for transporting a surface treatment medium which is fed to one of these supply channels via a feeding point and which is distributed via said openings onto said major surfaces of said semiconductor wafers;

wherein a cross-section of said openings varies along a first direction.

2. The device according to claim 1, wherein said cross-section increases with increasing distance from said feeding point.

3. The device according to claim 1, wherein said supply channels are symmetrically arranged with respect to said feeding point.

4. The device according to claim 1, wherein said supply channels comprise a first supply channel being arranged essentially in the middle of the first row and perpendicular thereto; and a plurality of second supply channels being arranged essentially perpendicular to said first supply channel and connected thereto such that said second supply channels are essentially parallel to said first row.

5. The device according to claim 4, wherein said second supply channels have a length which is essentially equal to the length of said first row.

6. The device according to claim 4, wherein said second supply channels have a span which is essentially equal to a diameter of said plurality of wafers.

7. The device according to claim 4, wherein said feeding point is essentially in the middle of said first supply channel.

8. The device according to claim 4, wherein said cross-section of said openings is essentially constant along said first supply channel and increases in both directions in said second supply channels starting from a crossing with said first supply channel.

9. The device according to claim 8, wherein said cross-section of said openings linearly increases.

10. The device according to claim 1, wherein said surface treatment medium contains isopropanol alcohol in gaseous state.

11. The device according to claim 1, wherein said sidewall is a top lid of said cassette which is pivotably hinged.

* * * * *